(12) United States Patent
Sentoku et al.

(10) Patent No.: US 8,922,774 B2
(45) Date of Patent: Dec. 30, 2014

(54) METHOD OF MANUFACTURING DEVICE, AND SUBSTRATE

(71) Applicant: Canon Kabushiki Kaisha, Tokyo (JP)

(72) Inventors: Koichi Sentoku, Kawachi-gun (JP);
Shigeki Ogawa, Utsunomiya (JP);
Hideki Ina, Tokyo (JP)

(73) Assignee: Canon Kabushiki Kaisha (JP)

( * ) Notice: Subject to any disclaimer, the term of this patent is extended or adjusted under 35 U.S.C. 154(b) by 1 day.

(21) Appl. No.: 13/713,217

(22) Filed: Dec. 13, 2012

(65) Prior Publication Data

US 2013/0148122 A1    Jun. 13, 2013

(30) Foreign Application Priority Data

Dec. 13, 2011  (JP) ................................. 2011-272747
Nov. 28, 2012  (JP) ................................. 2012-260340

(51) Int. Cl.
  *G01B 11/00*   (2006.01)
  *H01L 21/76*   (2006.01)
  *H01L 23/544*  (2006.01)
  *G03F 9/00*    (2006.01)
  *G03F 7/20*    (2006.01)

(52) U.S. Cl.
  CPC .......... *G03F 7/70633* (2013.01); *G03F 9/7076* (2013.01); *G03F 9/7046* (2013.01)
  USPC ............................. 356/401; 257/797; 438/401

(58) Field of Classification Search
  None
  See application file for complete search history.

(56) References Cited

U.S. PATENT DOCUMENTS

| | | | | |
|---|---|---|---|---|
| 6,037,671 A | * | 3/2000 | Kepler et al. | 257/797 |
| 6,501,189 B1 | * | 12/2002 | Kim et al. | 257/797 |
| 7,190,455 B2 | * | 3/2007 | Matsumoto | 356/401 |
| 7,245,351 B2 | * | 7/2007 | Mattiza et al. | 355/55 |

FOREIGN PATENT DOCUMENTS

| | | | | |
|---|---|---|---|---|
| JP | 03151626 A | * | 6/1991 | |
| JP | 2003-092246 A | | 3/2003 | |
| JP | 2009-054737 A | | 3/2009 | |

* cited by examiner

*Primary Examiner* — Gordon J Stock, Jr.
(74) *Attorney, Agent, or Firm* — Rossi, Kimms & McDowell LLP

(57) ABSTRACT

A method includes a first step of forming a circuit pattern and an alignment mark on a substrate and a second step of measuring a position of the alignment mark and positioning the substrate. The alignment mark includes a first linear pattern arranged on one side of a first straight line, a second linear pattern arranged on the other side of the first straight line, a third linear pattern arranged on one side of a second straight line, and a fourth linear pattern arranged on the other side of the second straight line. The first step includes determining total number of the third and fourth linear patterns to be formed and total number of the first and second linear patterns to be formed based on required precisions in directions along the first and second straight lines.

10 Claims, 6 Drawing Sheets

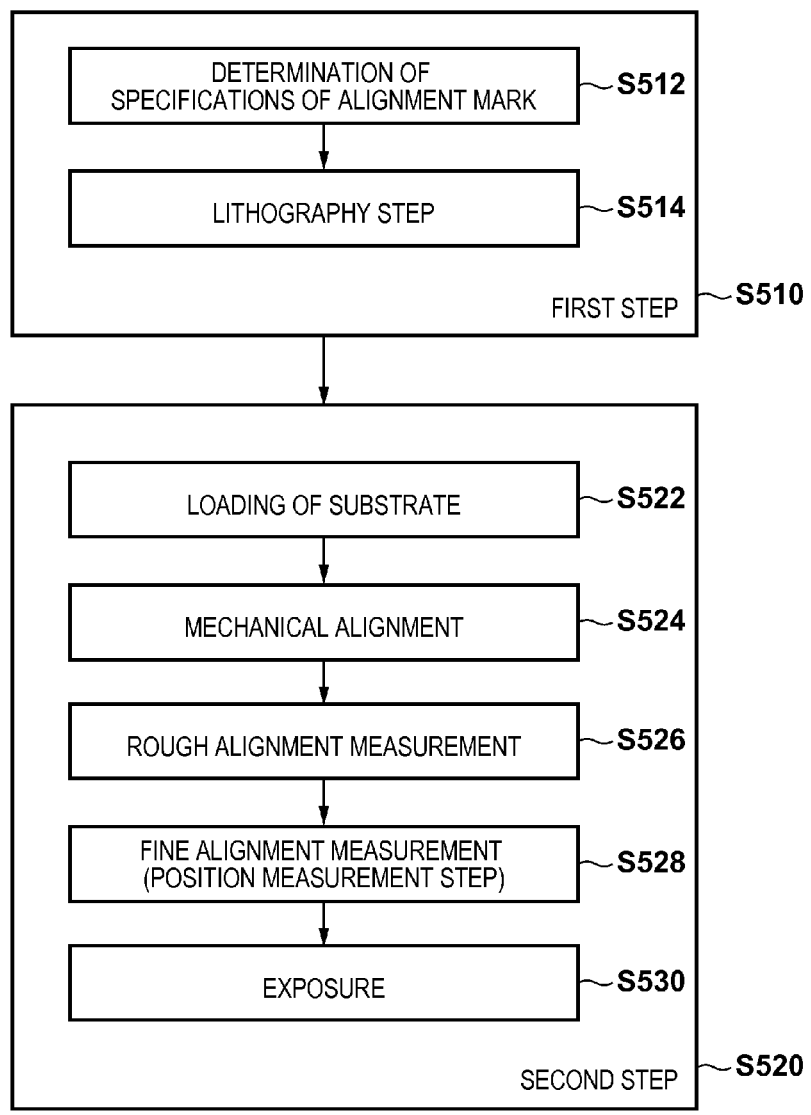

METHOD OF MANUFACTURING DEVICE, AND SUBSTRATE

BACKGROUND OF THE INVENTION

1. Field of the Invention

The present invention relates to a method of manufacturing a device, and a substrate.

2. Description of the Related Art

Japanese Patent Laid-Open No. 2003-92246 describes an alignment mark including first measurement marks X1, X2, X3, and X4 and second measurement marks Y1 and Y2. The first measurement marks X1, X2, X3, and X4 are used to measure the position of the alignment mark in the X-direction. The second measurement marks Y1 and Y2 are used to measure the position of the alignment mark in the Y-direction. The second measurement marks Y1 and Y2 are arranged outside the region in which the first measurement marks X1, X2, X3, and X4 are arranged, and parallel to the direction in which scribe lines are extended. The position of the alignment mark in the X-direction is the average of the positions of the first measurement marks X1, X2, X3, and X4. The position of the alignment mark in the Y-direction is the average of the positions of the second measurement marks Y1 and Y2.

In the alignment mark described in Japanese Patent Laid-Open No. 2003-92246, the positions at which the second measurement marks Y1 and Y2 serving as marks for position measurement in the Y-direction are arranged are spaced apart from each other in the X-direction. Therefore, when the position of a substrate includes a rotation error, the position of the alignment mark in the Y-direction, that is, the average of the positions of the second measurement marks Y1 and Y2 is strongly influenced by the rotation error. This means that the alignment mark described in Japanese Patent Laid-Open No. 2003-92246 is disadvantageous in terms of determining the position of the alignment mark in the Y-direction with high precision.

Japanese Patent Laid-Open No. 2009-54737 describes an alignment mark including a mark with a given periodicity in the X-direction, and a mark with a given periodicity in the Y-direction.

Even when the position of the alignment mark is required to be measured with high precision, a maximum precision is not always required in both the X- and Y-directions. If, for example, a maximum precision is required in one of the X- and Y-directions, while it is not required in the other, measurement with a maximum precision in both the X- and Y-directions is disadvantageous in terms of the throughput.

SUMMARY OF THE INVENTION

The present invention provides, for example, a technique advantageous for satisfaction of both of position measurement precision for an alignment mark, and throughput.

One of the aspects of the present invention provides a method of manufacturing a device, the method comprising: a first step of forming a circuit pattern and an alignment mark on a substrate; and a second step of measuring a position of the alignment mark, positioning the substrate based on the measured position, and forming a circuit pattern on the positioned substrate, wherein the alignment mark includes a first linear pattern arranged on one side of and parallel to a first straight line, a second linear pattern arranged on the other side of and parallel to the first straight line, a third linear pattern arranged on one side of and parallel to a second straight of which a direction is different from a direction of the first straight line, and a fourth linear pattern arranged on the other side of and parallel to the second straight line, the first step includes a determination step of determining total number of the third linear patterns and the fourth linear patterns to be formed, and total number of the first linear patterns and the second linear patterns to be formed, in accordance with a first required alignment precision in a direction along the first straight line, and a second required alignment precision in a direction along the second straight line, and the second step measures the position of the alignment mark in the direction along the first straight line based on positions of the third linear patterns and the fourth linear patterns, and measures the position of the alignment mark in the direction along the second straight line based on positions of the first linear patterns and the second linear patterns.

Further features of the present invention will become apparent from the following description of exemplary embodiments with reference to the attached drawings.

BRIEF DESCRIPTION OF THE DRAWINGS

FIG. 5 is a flowchart illustrating a method of manufacturing a device; and

DESCRIPTION OF THE EMBODIMENTS

An embodiment of the present invention will be described below with reference to the accompanying drawings. This embodiment relates to a method of manufacturing a device. The method for manufacturing a device includes a first step of forming an alignment mark on a substrate such as a wafer, together with a circuit pattern, and a second step of measuring the position of the alignment mark, and forming a circuit pattern on the substrate while aligning the substrate based on the measured position.

The first step can include a step of determining the specifications of an alignment mark to be formed, and a lithography step of forming an alignment mark conforming to the determined specifications on a substrate. The lithography step can include, for example, a coating step, exposure step, development step, and etching step. In the coating step, a substrate is coated with a resist. In the exposure step, a latent image of a circuit pattern and alignment pattern is formed on the resist. In the development step, the resist is developed to form a resist pattern corresponding to the circuit pattern and alignment pattern. The exposure step can use a light exposure apparatus which exposes the resist to light, or a charged particle beam exposure apparatus (drawing apparatus) which draws a pattern (circuit pattern and alignment mark) on the resist with a charged particle beam such as an electron beam. The present invention is also applicable to the use of other lithography apparatuses such as an imprint apparatus which forms the pattern of an imprint material on a substrate.

In the second step, the position of the alignment mark formed on the substrate, together with the circuit pattern, is measured upon the first step, and the substrate is exposed to light while being aligned. This exposure operation can also use a light exposure apparatus which exposes the resist to light, or a charged particle beam exposure apparatus (drawing apparatus) which draws a pattern (circuit pattern and alignment mark) on the resist with a charged particle beam such as an electron beam.

Figure 2:
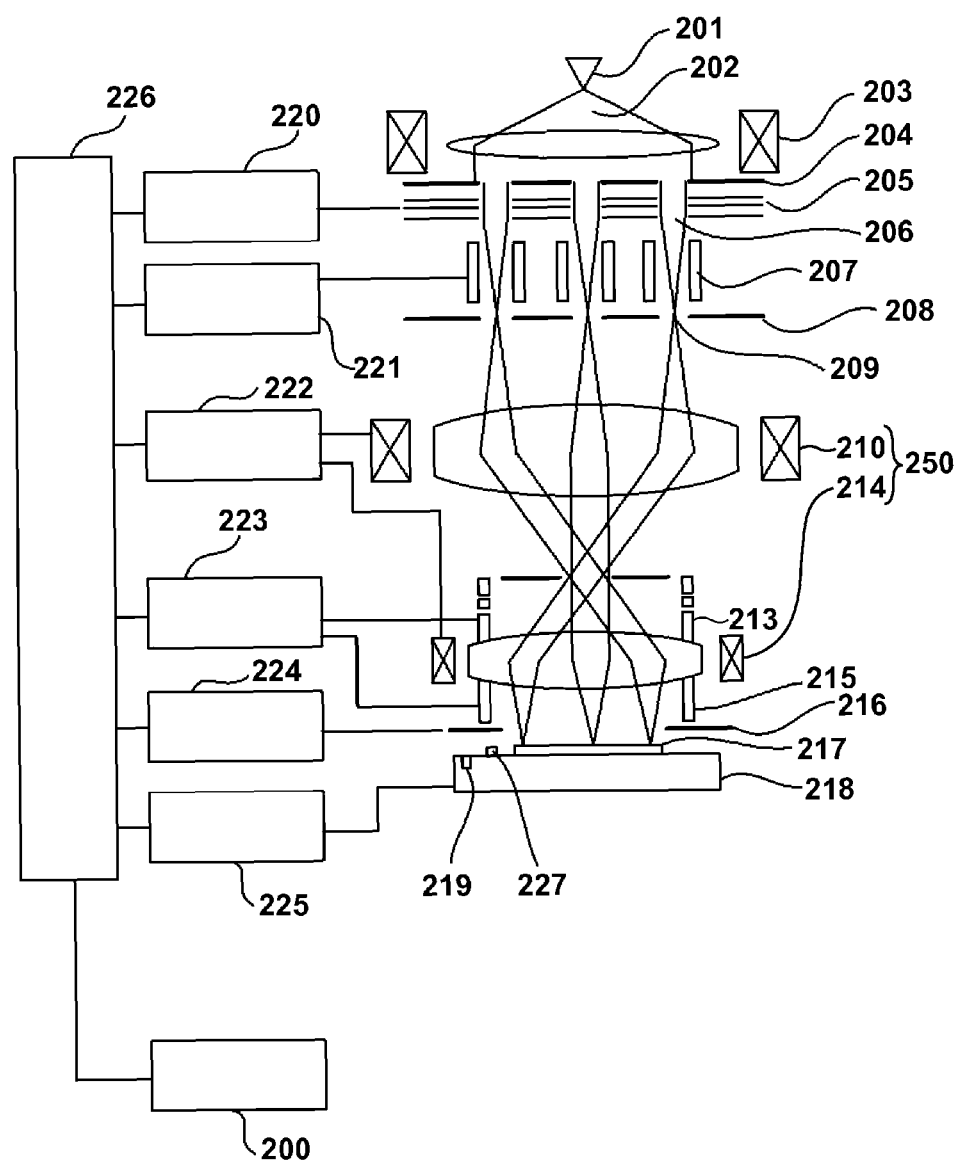
FIG. 2 is a view showing the schematic configuration of a charged particle beam exposure apparatus.

An exemplary example of a charged particle beam exposure apparatus will be described below with reference to FIG. 2 as a practical example of an exposure apparatus. An electron beam 202 emanated from the crossover of an electron gun 201 is converted into a nearly collimated electron beam by a condenser lens 203. The electron beam 202 nearly collimated by the condenser lens 203 is split into a plurality of electron beams 206 by an aperture array 204. The plurality of electron beams 206 form a plurality of intermediate images 209, respectively, of the crossover of the electron gun 201 in the vicinities of blanking apertures 208 by the action of a lens array 205 driven by a focus control circuit 220. The positions of the intermediate images 209 in the axial direction can be adjusted by controlling the powers of individual lenses which constitute the lens array 205. Upon application of a voltage to each blanker of a blanking array 207, the positions at which the intermediate images 209 are formed move in a direction perpendicular to the axial direction. With this operation, the electron beams 206 are blocked by the blanking apertures 208. On the other hand, when no voltage is applied to each blanker of the blanking array 207, the electron beams 206 are guided onto a substrate 217 while the positions at which the intermediate images 209 are formed remain the same. This makes it possible to control whether to guide the electron beams 206 onto the substrate 217, that is, ON/OFF of the electron beams 206.

The intermediate images 209 formed in the vicinities of the blanking apertures 208 are projected onto the substrate 217 set on a substrate stage 218 by a projection system 250 including a first projection lens 210 and second projection lens 214. The projection system 250 is driven by a lens control circuit 222 so as to match the rear focal position of the first projection lens 210 with the front focal position of the second projection lens 214. The electron beams 206 which form the intermediate images 209, respectively, are collectively deflected and positioned by a main deflector 213 and a sub-deflector 215. For example, the deflection width of the main deflector 213 can be set wide, while that of the sub-deflector 215 can be set narrow. An irradiation amount control circuit 221 controls ON/OFF of the electron beams 206 using the blankers, respectively, of the blanking array 207 under the control of a controller 226 based on pattern data. A deflection control circuit 223 controls the deflection operations of the main deflector 213 and sub-deflector 215 under the control of the controller 226 based on the pattern data. A stage control circuit 225 controls the positioning operation of the substrate stage 218 under the control of the controller 226 based on the pattern data. A pattern is drawn on the substrate 217 upon the ON/OFF control of the electron beams 206 using the blankers, respectively, of the blanking array 207, the control of the deflection operations of the main deflector 213 and sub-deflector 215, and the control of the positioning operation of the substrate stage 218 using the stage control circuit 225. The controller 226 can be connected to a computer 200 which supplies drawing data to the controller 226.

A position measurement mark 227 and a Faraday cup 219 are arranged on the substrate stage 218. An electron detector 216 is arranged above the substrate stage 218. A signal detected by the electron detector 216 is processed by a signal processing circuit 224 to detect the amount of electron beam.

Figure 3:
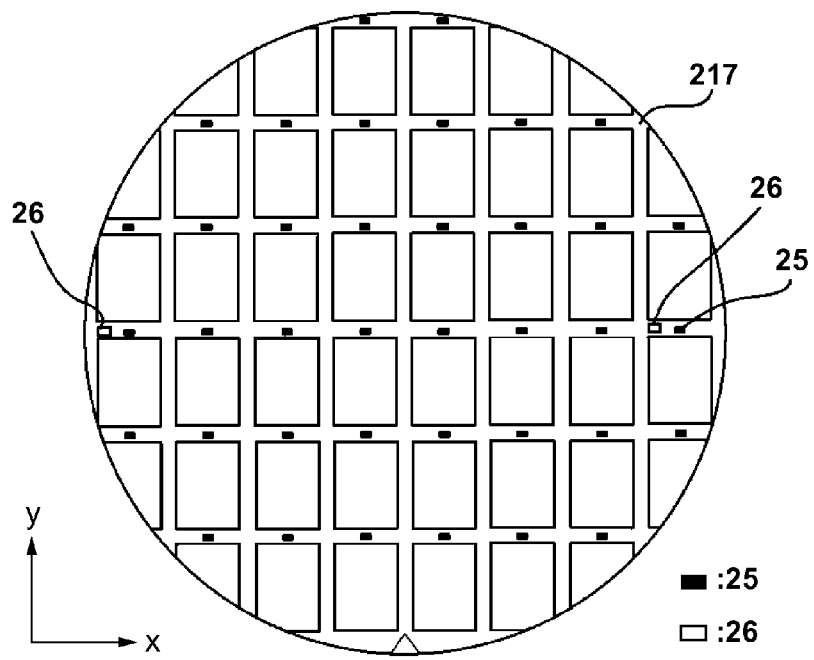
FIG. 3 is a view illustrating an array of shot regions and alignment marks on a substrate.
Figure 4:
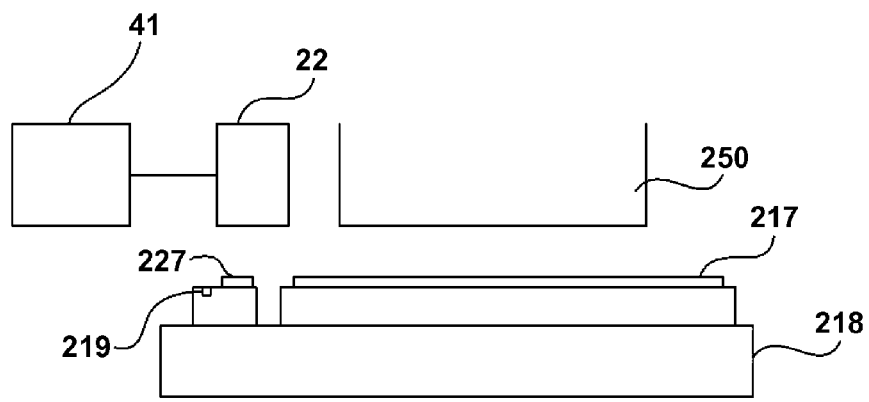
FIG. 4 is a view illustrating the arrangement of an alignment scope.

FIG. 3 illustrates an array of shot regions and alignment marks 25 and 26 on the substrate 217. Note that a circuit pattern is formed in each shot region. FIG. 4 illustrates a more detailed configuration of the portion surrounding the substrate 217 in the charged particle beam exposure apparatus shown in FIG. 2. An off-axis alignment scope 22 is arranged near the projection system 250. The positions of the alignment marks 25 and 26 can be detected by detecting, by the alignment scope 22, images of a plurality of alignment marks formed on the substrate 217, and processing the images by a signal processing unit 41.

A method of manufacturing a device according to this embodiment will be described in detail below with reference to FIG. 5. The method for manufacturing a device includes first step S510 of forming an alignment mark on a substrate 217, together with a circuit pattern, and second step S520 of measuring the position of the alignment mark, and exposing the substrate 217 to light while aligning the substrate 217 based on the measured position.

First step S510 can include specification determination step S512 of determining the specifications of an alignment mark 25 to be formed, and lithography step S514 of forming an alignment mark 25 conforming to the determined specifications on a substrate, together with a circuit pattern. Note that in specification determination step S512, the specifications of a rough alignment mark 26 can also be determined. In lithography step S514, a rough alignment mark 26 can also be formed. Lithography step S514 can include a coating step, exposure step, development step, and etching step. The exposure step can use, for example, the above-mentioned charged particle beam exposure apparatus. When a light exposure apparatus is used in the exposure step, it is necessary to manufacture a mark having a pattern for forming an alignment mark 25 conforming to the specifications determined in specification determination step S512.

The specifications of the alignment mark 25 will be described herein with reference to FIG. 1A. The alignment mark 25 includes at least one first linear pattern including first linear patterns 111a and 111b, and at least one second linear pattern including second linear patterns 111c and 111d. The alignment mark 25 also includes at least one third linear pattern including third linear patterns 121a to 121d, and at least one fourth linear pattern including fourth linear patterns 121e to 121h. The first linear patterns 111a and 111b are arranged on one side of and parallel to a first straight line 110. The second linear patterns 111c and 111d are arranged on the other side of and parallel to the first straight line 110. The third linear patterns 121a to 121d are arranged on one side of and parallel to a second straight line 120 perpendicular to the first straight line 110. Note that the second straight line 120 need not always be perpendicular to the first straight line 110 as long as they extend in different directions. The fourth linear patterns 121e to 121h are arranged on the other side of and parallel to the second straight line 120. In this example, the first straight line 110 is parallel to the X-axis, and the second straight line 120 is parallel to the Y-axis. The alignment mark 25 as mentioned above is less susceptible to a rotation error of the substrate 217 (than, for example, the alignment mark described in Japanese Patent Laid-Open No. 2003-92246), and is therefore advantageous in terms of measuring the position of the alignment mark 25 with high precision even if the position of the substrate 217 includes a rotation error.

The distance between the first linear pattern 111a (which is closer to the first straight line 110 between the first linear patterns 111a and 111b) and the second linear pattern 111c (which is closer to the first straight line 110 between the second linear patterns 111c and 111d) is preferably equal to that between the third linear pattern 121a (which is closest to the second straight line 120 among the third linear patterns 121a to 121d) and the fourth linear pattern 121e (which is closest to the second straight line 120 among the fourth linear patterns 121e to 121h). In such specifications, when the conditions in which the position of the alignment mark 25 is detected are optimized, the position detection precisions in both the X- and Y-directions can be set high. This is because the third linear patterns 121a to 121d and fourth linear patterns 121e to 121h for position measurement in the X-direction, and the first linear patterns 111a and 111b and second linear patterns 111c and 111d for position measurement in the Y-direction have high similarity.

In specification determination step S512, as the specifications of the alignment mark 25, (1) the total number N34 of at least one third linear pattern including third linear patterns 121a to 121d and at least one fourth linear pattern including fourth linear patterns 121e to 121h, and (2) the total number N12 of at least one first linear pattern including first linear patterns 111a and 111b and at least one second linear pattern including second linear patterns 111c and 111d are determined in accordance with a first required alignment precision in the direction along the first straight line 110, and a second required alignment precision in the direction along the second straight line 120.

Specification determination step S512 can be executed by a computer such as the computer 200. The relationship between the required alignment precision and the number of linear patterns, and a method for determining the total numbers N34 and N12 based on this relationship will be described in detail below. FIGS. 1B and 1C illustrate detection signals obtained upon observing the alignment mark 25 shown in FIG. 1A through the alignment scope 22 and, more specifically, signals output from a photoelectric converter built into the alignment scope 22. Note that FIG. 1B shows a signal obtained for the third linear patterns 121a to 121d and fourth linear patterns 121e to 121h for measuring the position of the alignment mark 25 in the X-direction. Also, FIG. 1C shows a signal obtained for the first linear patterns 111a and 111b and second linear patterns 111c and 111d for measuring the position of the alignment mark 25 in the Y-direction. The entire alignment mark 25 can be configured to fall within the field of view of the alignment scope 22.

In step S528 (to be described later), the signal processing unit 41 processes the signal illustrated in FIG. 1B, which is supplied from the alignment scope 22, thereby determining a plurality of peak positions Px1, Px2, Px3, Px4, Px5, Px6, Px7, and Px8 in this signal. This amounts to determining the positions of the individual third linear patterns 121a to 121d and fourth linear patterns 121e to 121h. Further, based on the determined peak positions Px1, Px2, Px3, Px4, Px5, Px6, Px7, and Px8, the signal processing unit 41 calculates the position of the alignment mark 25 in the X-direction in accordance with:

$$X\_position=(Px1+Px2+Px3+Px4+Px5+Px6+Px7+Px8)/8 \quad (1)$$

Similarly, in step S528 (to be described later), the signal processing unit 41 processes the signal illustrated in FIG. 1C, which is supplied from the alignment scope 22, thereby determining a plurality of peak positions Py1, Py2, Py3, and Py4 in this signal. This amounts to determining the positions of the individual first linear patterns 111a and 111b and second linear patterns 111c and 111d. Further, based on the determined peak positions Py1, Py2, Py3, and Py4, the signal processing unit 41 calculates the position of the alignment mark 25 in the Y-direction in accordance with:

$$Y\_position=(Py1+Py2+Py3+Py4)/4 \quad (2)$$

The measurement reproducibility precisions as the measurement precisions of the positions in the X- and Y-directions, which are calculated in accordance with equations (1) and (2), respectively, are proportional to the numbers of peak positions used for position calculation, that is, the square roots of the numbers of linear patterns. Then, in the case of the alignment mark 25 illustrated in FIG. 1A, the ratio between a measurement precision Ax in the X-direction and a measurement precision Ay in the Y-direction (in this example, the measurement reproducibility precision and the measurement precision are, for example, the reciprocal of the measurement error, and improve as their numerical values increase) is given by:

$$Ax:Ay=\sqrt{8}:\sqrt{4}=\sqrt{2}:1 \quad (3)$$

Equation (3) can be more generally expressed as:

$$Ax:Ay=\sqrt{N34}:\sqrt{N12} \quad (4)$$

Accordingly, as long as, for example, the number of linear patterns required in one of the X- and Y-directions, in which the required alignment precision is higher, is determined, the number of linear patterns required to satisfy the required alignment precision in the other direction can be determined in accordance with equation (4). That is, in specification determination step S512, the total numbers N34 and N12 can be determined so that the ratio between the square roots of the total numbers N34 and N12 becomes equal to that between the first required alignment precision and the second required alignment precision. Note that the total number N34 influences the measurement precision (and, eventually, the alignment precision) in the X-direction, and the total number N12 influences the measurement precision (and, eventually, the alignment precision) in the Y-direction. Also, the first required alignment precision is defined as the required alignment precision in the X-direction, and the second required alignment precision is defined as the required alignment precision in the Y-direction.

Second step S520 will be described below. First step S510 and second step S520 may use the same or different exposure apparatuses. Although the charged particle beam exposure apparatus illustrated in FIG. 2 is used in both of first step S510 and second step S520 for the sake of convenience, the present invention is not limited to this.

Second step S520 can include, for example, steps S522, S524, S526, S528, and S530. In step S522, a substrate 217 is loaded onto a substrate chuck 401 on the substrate stage 218. In step S524, mechanical alignment of the substrate 217 is performed. In step S526, rough alignment measurement is performed using the alignment mark 26 illustrated in FIG. 3.

Figure 1A:
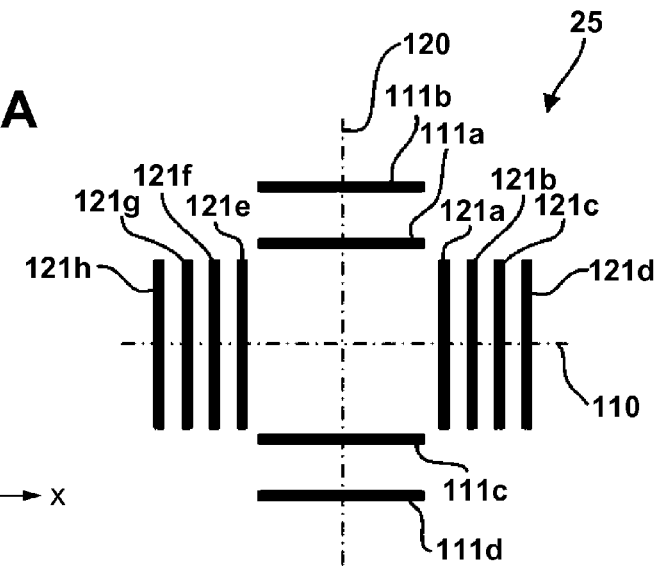
FIGS. 1A to 1C are views illustrating an alignment mark and detection signals obtained by this mark.
Figure 1B:
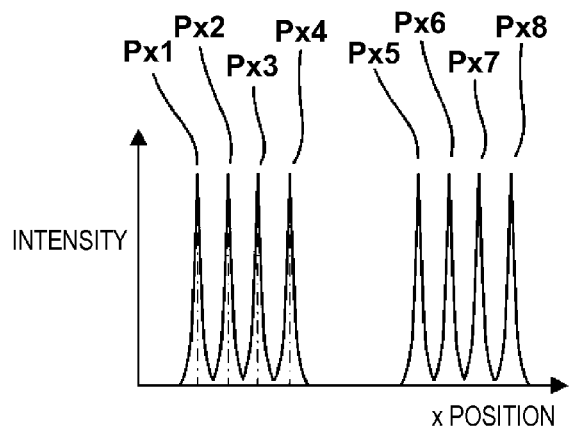
Figure 1C:
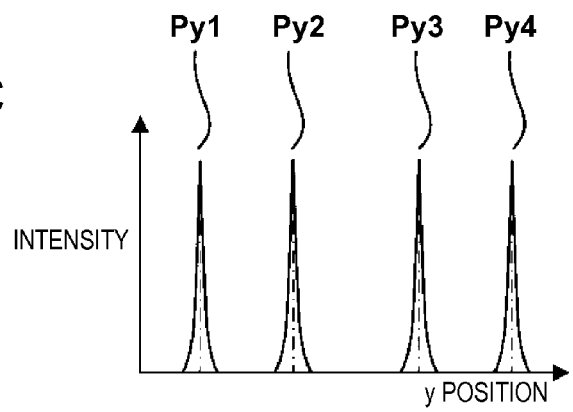

In step (position measurement step) S528, fine alignment measurement is performed using the alignment mark 25 illustrated in FIGS. 3 and 1A. More specifically, the alignment mark 25 is observed through the alignment scope 22 to determine the position of the alignment mark 25 in the X-direction, and that of the alignment mark 25 in the Y-direction using the above-mentioned method by the signal processing unit 41. This process is performed for a plurality of alignment marks 25.

In step S530, the substrate 217 is exposed to light while being aligned based on the result of the fine alignment measurement (the position of the alignment mark 25). Note that the parallel eccentricities, rotations, and magnifications of all shot regions formed on the substrate 217 can be calculated by statistically processing the measurement results of the positions of a plurality of wafer alignment marks 25 obtained in step S528. A method for performing alignment upon calculating such information is called global alignment. In this case, one or more alignment marks 25 can be formed on scribe lines in each shot region.

As described above, in this embodiment, the number of linear patterns for position measurement in the X-direction, and the number of linear patterns for position measurement in the Y-direction are determined in accordance with the required alignment precisions in the X- and Y-directions, respectively. This makes it possible to improve the throughput while satisfying required alignment precisions.

An example of a process which uses different required alignment precisions in the X- and Y-directions is cutting lithography. As another, more common example, the required alignment precisions in the X- and Y-directions are determined based on, for example, the shape of a circuit pattern, and are generally different from each other.

Figure 6A:
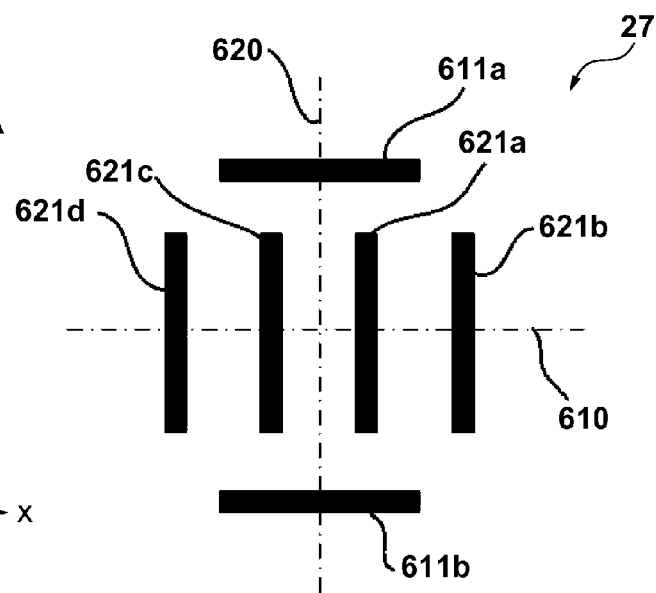
FIGS. 6A to 6C are views illustrating another alignment mark and detection signals obtained by this mark.

FIG. 6A shows the specifications of another alignment mark 25. The alignment mark 25 includes at least one first linear pattern 611a, at least one second linear pattern 611b, at least one third linear pattern including third linear patterns 621a and 621b, and at least one fourth linear pattern including fourth linear patterns 621c and 621d. The first linear pattern 611a is arranged on one side of and parallel to a first straight line 610. The second linear pattern 611b is arranged on the other side of and parallel to the first straight line 610. The third linear patterns 621a and 621b are arranged on one side of and parallel to a second straight line 620 perpendicular to the first straight line 610. The fourth linear patterns 621c and 621d are arranged on the other side of and parallel to the second straight line 620. In this example, the first straight line 610 is parallel to the X-axis, and the second straight line 620 is parallel to the Y-axis.

Figure 6B:
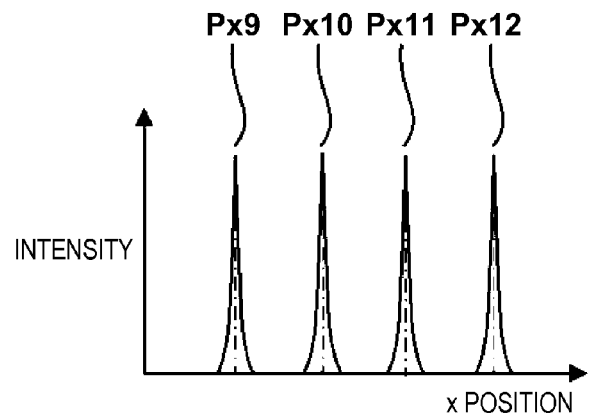
Figure 6C:
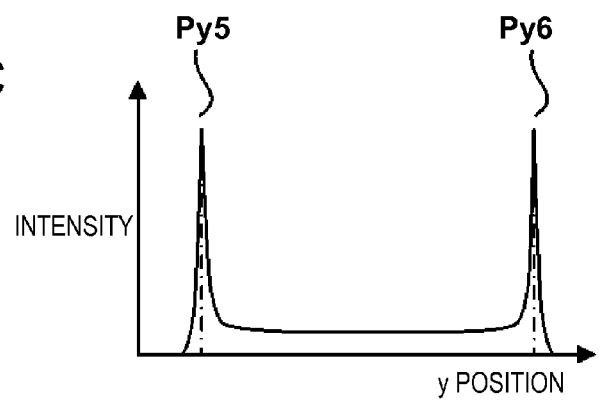

FIGS. 6B and 6C illustrate signals obtained upon observing an alignment mark 27 shown in FIG. 6A through the alignment scope 22 and, more specifically, signals output from the photoelectric converter built into the alignment scope 22. Note that FIG. 6B shows a signal obtained for the third linear patterns 621a and 621b and fourth linear patterns 621c and 621d for measuring the position of the alignment mark 27 in the X-direction. Also, FIG. 6C shows a signal obtained for the first linear pattern 611a and second linear pattern 611b for measuring the position of the alignment mark 27 in the Y-direction. The entire alignment mark 27 can be configured to fall within the field of view of the alignment scope 22.

Figure 7:
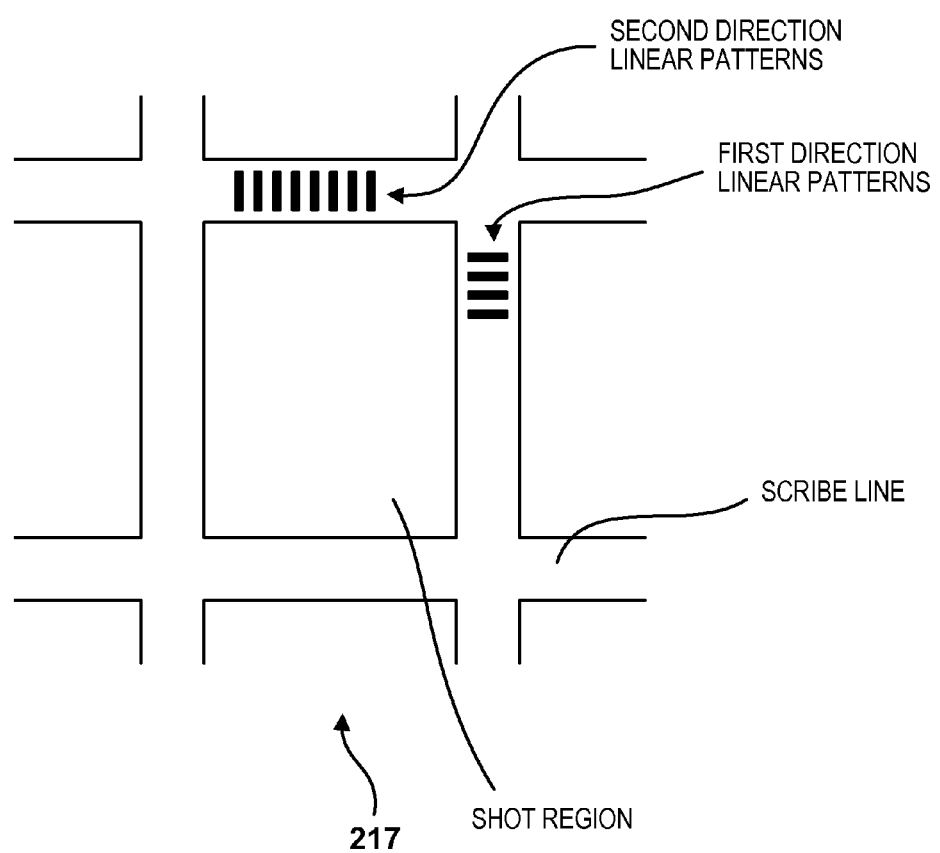
FIG. 7 shows an example of an arrangement of the first direction liner patters and the second direction linear patterns.

The above-mentioned first and second linear patterns can be considered as first direction linear patterns, and the above-mentioned third and fourth linear patterns can be considered as second direction linear patterns. In this case, the alignment mark 25 includes first direction linear patterns 111a to 111d arranged parallel to a first straight line 110, and second direction linear patterns 121a to 121h arranged parallel to a second straight line 120 (perpendicular to or different in direction from the first straight line 110). First step S510 includes a determination step of determining the number of first direction linear patterns to be formed, and the number of second direction linear patterns to be formed, in accordance with a first required alignment precision in the direction along the first straight line 110, and a second required alignment precision in the direction along the second straight line 120. In second step S520, the position of the alignment mark 25 in the direction along the first straight line 110 is obtained based on the positions of the individual second direction linear patterns, and the position of the alignment mark 25 in the direction along the second straight line 120 is obtained based on the positions of the individual first direction linear patterns. Note that only one first direction linear pattern and/or only one second direction linear pattern may be used. Further note that the first direction linear patterns and the second direction linear patterns may be respectively arranged in different scribe lines around the same shot region as shown in FIG. 7.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2011-272747, filed Dec. 13, 2011 and 2012-260340, filed Nov. 28, 2012, which are hereby incorporated by reference herein in their entirety.

What is claimed is:

1. A method of manufacturing a device, the method comprising:
a first step of forming a circuit pattern and an alignment mark on a substrate; and
a second step of measuring a position of the alignment mark, positioning the substrate based on the measured position, and forming a circuit pattern on the positioned substrate,
wherein the alignment mark includes a first linear pattern arranged on one side of and parallel to a first straight line, a second linear pattern arranged on the other side of and parallel to the first straight line, a third linear pattern arranged on one side of and parallel to a second straight line with a direction thereof being different from a direction of the first straight line, and a fourth linear pattern arranged on the other side of and parallel to the second straight line,
wherein the first step includes a determination step of determining a total number of the third linear pattern and the fourth linear pattern to be formed, and a total number of the first linear pattern and the second linear pattern to be formed, in accordance with a first required alignment precision in a direction along the first straight line, and a second required alignment precision in a direction along the second straight line, respectively, and
wherein the second step measures the position of the alignment mark in the direction along the first straight line based on positions of the third linear pattern and the fourth linear pattern, and measures the position of the alignment mark in the direction along the second straight line based on positions of the first linear pattern and the second linear pattern.

2. The method according to claim 1, wherein the determination step determines the total number of the third linear pattern and the fourth linear pattern to be formed, and the total number of the first linear pattern and the second linear pattern to be formed so that a ratio between a square root of the total number of the third linear pattern and the fourth linear pattern to be formed and a square root of the total number of the first linear pattern and the second linear pattern to be formed becomes equal to a ratio between the first required alignment precision and the second required alignment precision.

3. The method according to claim 1, wherein a distance between the first linear pattern to be formed closest to the first straight line, and the second linear pattern to be formed closest to the first straight line is equal to a distance between the third linear pattern to be formed closest to the second straight line, and the fourth linear pattern to be formed closest to the second straight line.

4. A method of manufacturing a device, the method comprising:
a first step of forming a circuit pattern and an alignment mark on a substrate; and
a second step of measuring a position of the alignment mark, positioning the substrate based on the measured position, and forming a circuit pattern on the positioned substrate,
wherein the alignment mark includes a first linear pattern arranged on one side of and parallel to a first straight line, a second linear pattern arranged on the other side of and parallel to the first straight line, a third linear pattern arranged on one side of and parallel to a second straight line with a direction thereof being different from a direction of the first straight line, and a fourth linear pattern arranged on the other side of and parallel to the second straight line,
wherein the first step determines a total number of the third linear pattern and the fourth linear pattern to be formed, and a total number of the first linear pattern and the second linear pattern to be formed so that a ratio between a square root of the total number of the third linear pattern and the fourth linear pattern to be formed and a square root of the total number of the first linear pattern and the second linear pattern to be formed becomes equal to a ratio between a first required alignment precision in a direction along the first straight line and a second required alignment precision in a direction along the second straight line.

5. A method of manufacturing a device, the method comprising:
a first step of forming a circuit pattern and an alignment mark on a substrate; and
a second step of measuring a position of the alignment mark, positioning the substrate based on the measured position, and forming a circuit pattern on the positioned substrate, wherein the alignment mark includes a first direction linear pattern arranged along a first straight line, and a second direction linear pattern arranged along a second straight line with a direction thereof being different from a direction of the first straight line,
wherein the first step includes a determination step of determining a number of the second direction linear pattern to be formed, and a number of the first direction linear pattern to be formed, in accordance with a first required alignment precision in a direction along the first straight line, and a second required alignment precision in a direction along the second straight line, respectively, and
wherein the second step measures the position of the alignment mark in the direction along the first straight line based on a position of the determined number of the second direction linear pattern, and measures the position of the alignment mark in the direction along the second straight line based on a position of the determined number of the first direction linear pattern.

6. A substrate comprising:
a circuit pattern formed with first and second required alignment precisions for the substrate different from each other in directions of first and second straight lines, a direction of the first straight line being different from a direction of the second straight line; and
an alignment mark that includes a plurality of first linear patterns arranged on one side of and parallel to the first straight line, a plurality of second linear patterns arranged on the other side of and parallel to the first straight line, a plurality of third linear patterns arranged on one side of and parallel to the second straight line, and a plurality of fourth linear patterns arranged on the other side of and parallel to the second straight line, and
wherein a total number of the plurality of first linear patterns and the plurality of second linear patterns, and a total number of the plurality of third linear patterns and the plurality of fourth linear patterns accord with the second required alignment precision, and the first required alignment precision, respectively.

7. The substrate according to claim 6, wherein a distance between one of the plurality of first linear patterns to be formed closest to the first straight line, and one of the plurality of second linear patterns to be formed closest to the first straight line is equal to a distance between one of the plurality of third linear patterns to be formed closest to the second straight line, and one of the plurality of fourth linear patterns to be formed closest to the second straight line.

8. A substrate comprising:
a circuit pattern formed with first and second required alignment precisions for the substrate different from each other in directions of first and second straight lines, a direction of the first straight line being different from a direction of the second straight line; and
an alignment mark that includes a plurality of first direction linear patterns arranged along the first straight line, and a plurality of second direction linear patterns arranged along the second straight line, and
wherein a total number of the plurality of first direction linear patterns and a total number of the plurality of second direction linear patterns accord with the second required alignment precision and the first required alignment precision, respectively.

9. A substrate comprising:
an alignment mark that includes a plurality of first linear patterns arranged on one side of and parallel to a first straight line, a plurality of second linear patterns arranged on the other side of and parallel to the first straight line, a plurality of third linear patterns arranged on one side of and parallel to a second straight line with a direction thereof being different from a direction of the first straight line, and a plurality of fourth linear patterns arranged on the other side of and parallel to the second straight line,
wherein the plurality of first linear patterns and the plurality of second linear patterns are arranged line-symmetric with respect to the first straight line, each of the plurality of first linear patterns is line-symmetric with respect to the second straight line, and each of the plurality of second linear patterns is line-symmetric with respect to the second straight line,
wherein the plurality of third linear patterns and the plurality of fourth linear patterns are arranged line-symmetric with respect to the second straight line, each of the plurality of third linear patterns is line-symmetric with respect to the first straight line, and each of the plurality of fourth linear patterns is line-symmetric with respect to the first straight line, and
total number of the plurality of first linear patterns and the plurality of second linear patterns is different from total number of the plurality of third linear patterns and the plurality of fourth linear patterns.

10. The substrate according to claim 9, wherein a distance between one of the plurality of first linear patterns to be formed closest to the first straight line, and one of the plurality of second linear patterns to be formed closest to the first straight line is equal to a distance between one of the plurality of third linear patterns to be formed closest to the second straight line, and one of the plurality of fourth linear patterns to be formed closest to the second straight line.

* * * * *